United States Patent

[11] 3,588,752

[72] Inventor Edward Hirshfield
San Jose, Calif.
[21] Appl. No. 853,733
[22] Filed Aug. 28, 1969
[45] Patented June 28, 1971
[73] Assignee Sylvania Electric Products Inc.

[54] TRACKING FILTER
1 Claim, 6 Drawing Figs.

[52] U.S. Cl. ........ 333/17, 333/70, 334/15, 334/16, 331/177, 331/77
[51] Int. Cl. ........ H03h 7/10
[50] Field of Search ........ 333/17, 70; 334/15—16

[56] References Cited
UNITED STATES PATENTS
2,976,408 3/1961 Colaguori ........ 333/17X
3,187,275 6/1965 Stanley ........ 333/17
3,281,722 10/1966 Hellwarth ........ 333/17
3,355,667 11/1967 Bruene ........ 333/17X
3,390,337 6/1968 Beitman, Jr ........ 333/17X

*Primary Examiner*—Herman Karl Saalbach
*Assistant Examiner*—Marvin Nussbaum
*Attorneys*—Norman J. O'Malley, Russell A. Cannon and John F. Lawler

ABSTRACT: Spurious signals other than a selected signal in the output of a synthesizer are filtered out by a tracking filter comprising a phase discriminator. The discriminator includes the series combination of a first power divider, a voltage tuned band-pass filter (VTF), and a second power divider. A linear control voltage from the synthesizer is applied to the VTF to tune the center frequency of the passband of the latter to be approximately equal to the frequency of the selected signal in the synthesizer output. The second outputs of the power dividers are combined in a phase detector to produce an error voltage that is applied to the VTF to tune the center frequency of the passband thereof to be equal to the selected frequency.

INVENTOR.
EDWARD HIRSHFIELD

BY Russell A. Cannon
AGENT

TRACKING FILTER

BACKGROUND OF INVENTION

This invention relates to filters and more particularly to an automatically electronically tuned tracking filter.

A digitally tuned frequency synthesizer translates the stable frequency of a precision frequency standard such as a crystal oscillator to any selected one of many frequencies. The new frequency may be selected electronically or by energizing pushbutton switches. The output signal of the synthesizer may comprise a component having the selected frequency and spurious components having nonharmonically related frequencies. A prior art technique for eliminating spurious components from the output of the synthesizer employs a voltage tuned band-pass filter (VTF) comprising a varactor diode. Whenever a new frequency is selected, a new tuning voltage is applied to the varactor diode to tune the VTF to pass the selected frequency. In order to cause the center frequency of the passband of the VTF to vary linearly as successive new frequencies are selected a nonlinear tuning voltage must be applied to the varactor diode. Circuitry for generating a nonlinear tuning voltage is complex.

An object of this invention is the provision of an improved filter that develops its own error voltage for tuning the center frequency of the filter passband to be equal to the frequency of an incident signal.

SUMMARY OF INVENTION

Briefly, a voltage is applied to a voltage tuned filter in a phase discriminator to tune the center frequency of the filter passband. The error voltage produced by the phase discriminator is applied to the filter to cause the center frequency of the filter passband to track the frequency of an applied signal in the filter passband.

DESCRIPTION OF PREFERRED EMBODIMENT

Figure 2:
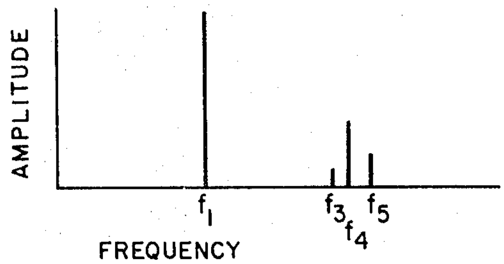
FIG. 2 is a representation of frequencies in the output signal of the synthesizer of FIG. 1.
Figure 3:
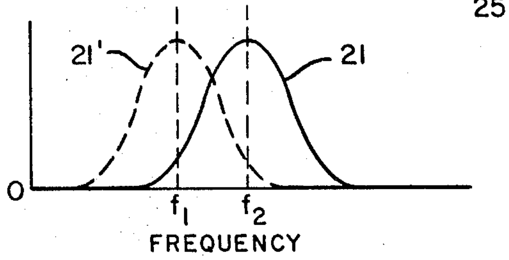
FIG. 3 is curves representing the amplitude response characteristic of the voltage controlled filter of FIG. 1.
Figure 4:
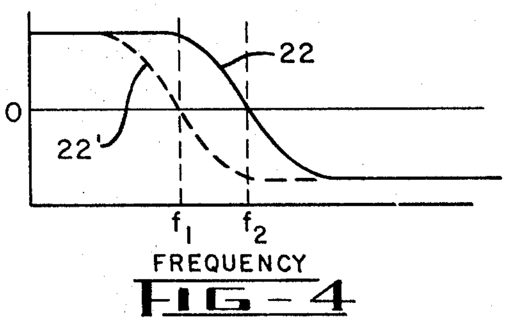
FIG. 4 is curves representing the phase response characteristic of the voltage controlled filter of FIG. 1.
Figure 5:
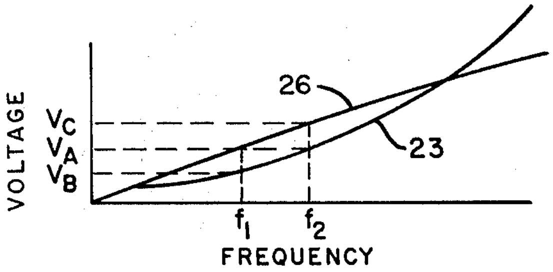
FIG. 5 is curves useful in explaining the operation of this invention.
Figure 1:
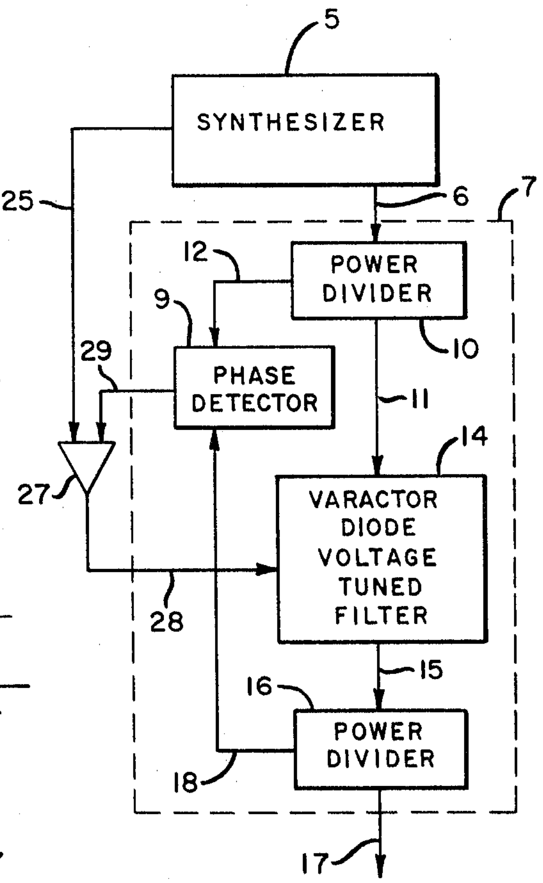
FIG. 1 is a block diagram of a system embodying this invention.

Referring now to FIG. 1, synthesizer 5 produces an output signal having a selected frequency $f_1$, see FIG. 2, which is applied on line 6 to phase discriminator 7. The phase discriminator comprises a phase detector 9 and the series combination of a first power divider 10, voltage tuned filter (VTF) 14 and a second power divider 16. VTF 14 is a band-pass filter having a frequency response that is represented by the curve 21 in FIG. 3. The phase response of filter 14 is represented by curve 22 in FIG. 4. The VTF preferably comprises a varactor diode which causes the filter to have a nonlinear tuning voltage vs. frequency transfer function which is represented by curve 23 in FIG. 5.

Synthesizer 5 may, by way of example, be a device that produces an output signal having a selected frequency $f_1$ that is tuned linearly across a band of frequencies. Alternatively, the signal applied on line 6 to the phase discriminator may be an intermediate frequency (IF) signal having a varying frequency. The synthesizer also produces a linear tuning voltage on line 25 that is represented by curve 26 in FIG. 5. The linear tuning voltage on line 25 is coupled through summing amplifier 27 and is applied on line 28 to tune the center frequency of the passband of filter 14 to be approximately equal to the selected frequency $f_1$. The term linear tuning voltage means that when the synthesizer produces a linear change in the selected frequency, for example from frequency $f_1$ to $f_2$, see FIG. 5, there is a corresponding linear change in the tuning voltage on line 25 from the voltage $V_A$ to $V_C$.

Figure 6:
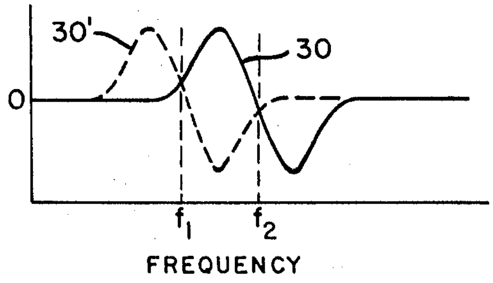
FIG. 6 is a curve representing the response characteristic of the phase discriminator of FIG. 1.

The output signal of the synthesizer is coupled through power divider 10, filter 14 and power divider 16 to provide an output signal on line 17 when the selected frequency of the synthesizer output signal is within the passband of the VTF. A portion of the synthesizer output is also coupled through the power dividers and is applied on lines 12 and 18 to the phase detector. The output of detector 9 on line 29 is also the output of the phase discriminator. The response characteristic of the discriminator is represented by curve 30 in FIG. 6 which is the product of the amplitude and phase response (curves 21 and 22, respectively) of filter 14.

Each power divider preferably has a linear phase response as a function of frequency. Stated differently, the differences between the phases of the outputs of each power divider are preferably constant as a function of frequency. The phase shifts provided by the power dividers and filter 14 are selected such that the signals on lines 12 and 18 are either 90° or 270° out of phase. By way of example, the varactor diode in filter 14 introduces a 90° difference between the phases of the input and output signals applied thereto on lines 11 and 15, respectively. Each power divider may also introduce a 90° difference between the phase of the second output signal thereof and the phases of the input signal thereto and the first output signal thereof. Thus, the phase of the signal on line 18 lags the phase of the signal on line 12 by 90° in the above example and the necessary requirements for the operation of the phase discriminator are satisfied. Detector 9 produces an error voltage on line 29 that is proportional to the difference between the frequency of the input signal on line 6 and the center frequencies $f_c$ of the discriminator response characteristic 30 and the filter response characteristic 21. This error voltage is also coupled through summing amplifier 27 and is applied to filter 14 to form a phase locked loop. The output voltage of detector 9 therefore controls the center frequencies $f_c$ of both the discriminator response characteristic 30 and the filter response characteristic 21.

In operation, the synthesizer is caused to produce a signal on line 6 having a selective frequency $f_1$, see FIG. 2. The signal on line 6 may, however, also contain undesired components having, for example, the frequencies $f_3$, $f_4$ and $f_5$. The synthesizer also produces a tuning voltage $V_A$, see FIG. 5, on line 25 which is applied to filter 14. It is desirable that this voltage $V_A$ tune the center frequency of the filter 14 passband response 21 to be equal to the frequency $f_1$ as indicated by curve 21′ in order to block the undesired signal components having the frequencies $f_3$—$f_5$ from the output signal on line 17. Since the transfer characteristic 23 of filter 14 is a nonlinear function of the applied voltage, however, the voltage $V_A$ tunes the center frequencies of the filter 14 passband and the discriminator response characteristic to be equal to the frequency $f_2$ which is only approximately equal to the frequency $f_1$. This condition is represented by curves 21 and 30. Since the capture range of the phase lock loop is greater than four times the 3db. bandwidth of the filter response 21, the discriminator is caused to lock onto the strongest signal component on line 6 which has the frequency $f_1$.

Detector 9 compares and produces an error voltage $V_A$—$V_B$ that is proportional to the difference between the frequency or phase of the discriminator response characteristic 30 and the frequency $f_1$ of the strongest signal component applied on line 6 to the discriminator. This error voltage on line 29 is also applied to filter 14 to tune the center frequency of the passband thereof and the discriminator response characteristic to be equal to the frequency $f_1$ as indicated by the curves 21′ and 30′, respectively. The error voltage produced by the discriminator causes the center frequency of the filter passband to track variations of the frequency of the strongest signal on line 6 from the frequency $f_1$.

I claim:

1. Apparatus for synthesizing a signal having a variable frequency and tracking variations in the frequency thereof comprising:

a synthesizer producing the synthesized signal and a linear tuning voltage; and a phase discriminator comprising;

a voltage tunable filter having first and second inputs and an output, a tunable frequency passband, and a nonlinear tuning characteristic, a phase detector having first and second inputs and an output;

first means coupling the synthesized signal to the first input of said filter and the first input of said detector;

second means coupling a portion of the signal on the output of said filter to the second input of said detector; and third means coupling the signal on the output of said detector and the linear tuning voltage to the second input of said filter to form a phase-locked loop for locking the center frequency of said frequency passband to the frequency of the synthesized signal in said passband and causing the passband center frequency to track variations in the frequency of the synthesized signal;

said first and second coupling means, detector and filter introducing a 90° difference between the phases of the signals applied to said detector.